(12) United States Patent
Zar (10) Patent No.: US 11,571,052 B2
(45) Date of Patent: Feb. 7, 2023

(54) REVERSIBLE COLLAPSIBLE SECURITY POUCH FOR ELECTRONIC DEVICES

(71) Applicant: Peeled Group, LLC, Aptos, CA (US)

(72) Inventor: Aaron Zar, Aptos, CA (US)

(73) Assignee: PEELED GROUP, LLC, Aptos, CA (US)

( * ) Notice: Subject to any disclaimer, the term of this patent is extended or adjusted under 35 U.S.C. 154(b) by 0 days.

(21) Appl. No.: 17/179,282

(22) Filed: Feb. 18, 2021

(65) Prior Publication Data

US 2021/0251357 A1 Aug. 19, 2021

Related U.S. Application Data

(60) Provisional application No. 62/978,219, filed on Feb. 18, 2020.

(51) Int. Cl.
*A45C 11/00* (2006.01)
*A45C 13/10* (2006.01)
*A45C 7/00* (2006.01)
*A45C 3/00* (2006.01)

(52) U.S. Cl.
CPC ............... *A45C 11/00* (2013.01); *A45C 3/001* (2013.01); *A45C 7/0077* (2013.01); *A45C 13/1046* (2013.01)

(58) Field of Classification Search
CPC ......... A45C 11/00; A45C 3/001; A45C 7/007; A45C 13/1046

USPC ........................................................... 383/88
See application file for complete search history.

(56) References Cited

U.S. PATENT DOCUMENTS

| 5,042,649 A | * | 8/1991 | McNutt | A45C 11/32 206/38.1 |
| 10,709,044 B1 | * | 7/2020 | Judy | H05K 9/0043 |
| 2012/0195530 A1 | * | 8/2012 | Kennedy | H04B 15/00 383/107 |
| 2017/0208905 A1 | * | 7/2017 | Viskup | A45C 11/32 |
| 2019/0090390 A1 | * | 3/2019 | Judy | A45C 13/1069 |

* cited by examiner

*Primary Examiner* — Jes F Pascua
(74) *Attorney, Agent, or Firm* — Myers Andras Ashman Bisol LLP; Joseph C. Andras (57) ABSTRACT

A Reversible Collapsible Security Pouch for Electronic Devices. The Pouch is provided in a variety of different configurations, and further are designed to accommodate a variety of different items. A key-fob-accommodating version is small enough to be attachable to the key fob when in a compacted condition so that it can always be attached to the key fob. The key fob version includes a pair of stretchable wrapping loops that allows the user to roll the pouch into a compact roll and then secure it in the rolled condition using one of the wrapping loops. In some larger pouch versions, there may be closure buttons around which a wrapping loop could be wrapped to secure the closure of the pouch. Other versions may include the ability to close and lock the pouch to secure the encapsulated device. All versions include a Faraday cage integrated into the pouch assembly.

9 Claims, 8 Drawing Sheets

REVERSIBLE COLLAPSIBLE SECURITY POUCH FOR ELECTRONIC DEVICES

This application is filed within one year of, and claims priority to Provisional Application Ser. No. 62/978,219, filed Feb. 18, 2020.

BACKGROUND OF THE INVENTION

1. Field of the Invention

This invention relates generally to Electromagnetic Shielding Devices and, more specifically, to a Reversible Collapsible Security Pouch for Electronic Devices.

2. Description of Related Art

Today's modern world has made it virtually mandatory that everyone carries a plurality of electronic devices on their person while out in public. The list of these portable electronic devices is long, and is only getting longer. Cellular telephones, vehicle remote controls, RFID pass-keys, digital cameras, iot devices, wearables, Bluetooth devices, radios, connected equipment, and even credit cards are included on this list. Included with the convenience provided by these numerous devices is also a substantial security hazard. Each of these electronic devices is, in varying levels, capable of being compromised by hostile "hackers" seeking to access personal data and/or security access data contained within the electronic devices.

In order to combat hostile attacks on personal electronic devices, a series of containers for electronic devices have been created that provide RF (radio frequency) shielding. The RF shielding in these containers is commonly provided by a "faraday cage" integrated within the inner compartment formed by the container. A faraday cage is an enclosure comprising a series of thin conductive filaments. These filaments are generally made of copper, but could also be made from silver, nickel, galvanized zinc, iron, aluminum, stainless steel or a combination of other conductive material or composite. Silver has long been known for its ability to kill some of the nasty microbes that can make people sick. In hospitals, it's used to help burn victims, to combat germs on catheters and even to wipe out dangerous "superbugs" that have grown resistant to traditional antibiotics. Now, capitalizing on consumers' fear of germs, companies are adding tiny, powerful silver particles to cutting boards, underwear, yoga mats, running shirts, socks and an expanding array of other "antibacterial" goods. Such products are made possible by recent advances in technology that allow manufacturers to create nano-sized silver and incorporate it into various materials. (A nanometer is one-billionth of a meter; a human hair is about 80,000 to 100,000 nanometers wide.)

A Faraday cage operates because an external electrical field causes the electric charges within the cage's conducting material to be distributed so that they cancel the field's effect in the cage's interior.[1] This means that items encased within a faraday cage-equipped container can neither transmit electronic signals, nor can they be accessed by external electronic signals attempting to activate or penetrate the electronic devices from outside of the cage.

[1] https://en.m.wikipedia.org/wiki/Faraday_cage

The problem with the RF-shielding containers on the market today is that they can be cumbersome and therefore inconvenient to carry at all times. This is particularly the case as it applies to protection of electronic key fob remote controls for vehicles (also may be referred to as Frequency Operated Buttons or Remote Keyless Entry Systems). Most key fobs use a rolling key—the key produces a new waveform that depends on the ID of the key fob, a random seed, and how many times the key fob has been pressed. The car keeps track of the last code it received, and knows what the next several hundred codes might be. If it detects one of the expected future codes it unlocks the car. If it gets a previously used code, it stops responding to the key fob (because it concludes that the signal emanated from a hacker).

Key fobs can also be subject to "relay attacks." Relay attacks can occur when there are cars that open when the owner gets close to the car. This is based on a low power signal that can only be received when the key fob is very close. This can be defeated by amplifying these small signals from the key fob, capturing the signal, and then relaying it back to the car.

Yet another key fob vulnerability is to "replay attacks." Replay Attacks describe when an individual (hacker) gains access to the key fob when the key fob is not within transmit/receive range of the vehicle. The hacker presses the key fob's button and records the several sequential signals. The hacker then plays these recorded signals later until one successfully unlocks the vehicle.

All of these hacker attacks can be thwarted by storing the key fob in a faraday cage, because the faraday cage will prevent the key from either transmitting or receiving electronic signals. Two problems with current faraday cage pouches make it nonfeasible for an owner to place his or her key fob in a faraday cage pouch—first, there are no current faraday cage-equipped pouches that are small enough so that they can be carried on or along with the owner's key fob, so that it is available at all times. Second, there is no such key fob-protective case or pouch that is lockable in order to prevent hackers from executing one of the previously-described hacks when the owner doesn't have the key fob in their direct possession (or accidental activation during maintenance or vulnerable to accidental or deliberate activation).

What is needed, then, is a faraday-cage-equipped pouch or container that is collapsible (to provide a small, conveniently portable package), and potentially also lockable.

SUMMARY OF THE INVENTION

In light of the aforementioned problems associated with the prior devices and methods, it is an object of the present invention to provide a Reversible Collapsible Security Pouch for Electronic Devices. The Pouch should be provided in a variety of different configurations, and further be designed to accommodate a variety of different items. A key-fob-accommodating version should be small enough to be attachable to the key fob when in a compacted condition so that it can always be attached to the key fob. The key fob version should include a pair of stretchable wrapping loops that allows the user to roll the pouch into a compact roll and then secure it in the rolled condition using one of the wrapping loops. In some larger pouch versions, there should be closure buttons around which a wrapping loop could be wrapped to secure the closure of the pouch. Other versions may include the ability to close and lock the pouch to secure the encapsulated device. All versions should include a Faraday cage integrated into the pouch assembly.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings, of which:

DETAILED DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the generic principles of the present invention have been defined herein specifically to provide a Reversible Collapsible Security Pouch for Electronic Devices.

Figure 1:
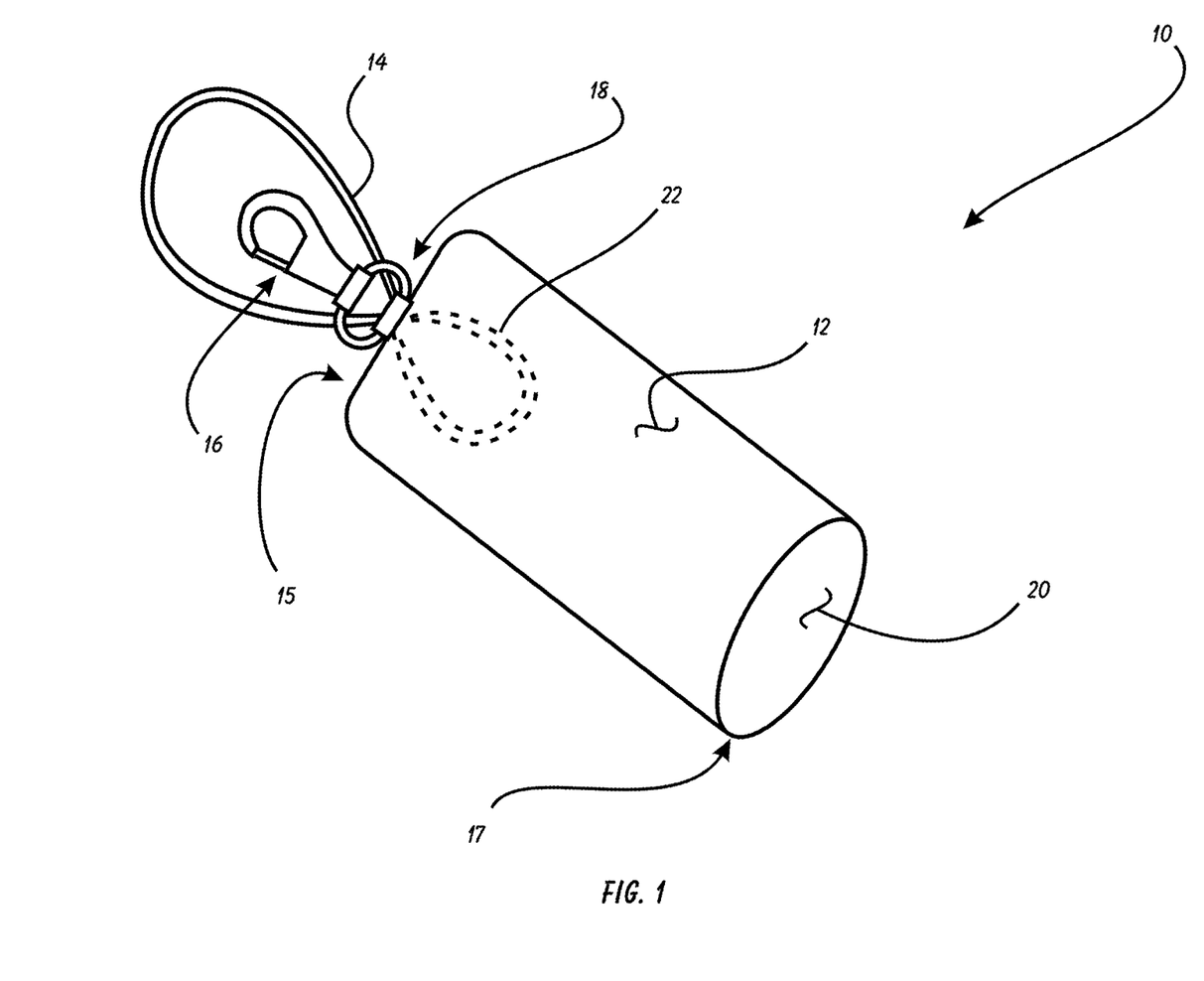
FIG. 1 is a perspective view of a preferred embodiment of the reversible collapsible security pouch of the present invention.

The present invention can best be understood by initial consideration of FIG. 1.[2] FIG. 1 is a perspective view of a preferred embodiment of the reversible collapsible security pouch 10 of the present invention. The pouch 10 (in the depicted position), has a flexible pouch made of a faraday cage 12 bonded or otherwise attached to an aesthetic pouch 20. The bonded pouches 12, 20 form a closed end 15 and an open end 17 (also defined as the mouth 17 of the pouch 10). The aesthetic pouch 20 can be made from a plurality of materials, including nylon mesh, leather, waterproof plastic or rubber and highly elastic fabric such as those used in the construction of socks, etc. The faraday cage pouch 12 is a mesh of thin wires either bonded to or otherwise incorporated with the material forming the aesthetic pouch 20 (i.e. one side of the pouch 20 is aesthetically pleasing and/or functional to protect a secured item, and the other surface has the faraday cage mesh attached to it.

[2] As used throughout this disclosure, element numbers enclosed in square brackets [ ] indicates that the referenced element is not shown in the instant drawing figure, but rather is displayed elsewhere in another drawing figure.

A fastener ring 18 protrudes from the closed end 15 of the pouch 12. Fastening clip 16, such as the keyring clip depicted here, is attached to the fastener ring 18. In other versions, other clip designs may comprise the fastening clip 16 (e.g. a carabiner or other design). A first wrapping loop 14 extends from the closed end 15 of the pouch 12 adjacent to the fastener ring 18. The first wrapping loop 14 is preferably made from a stretchable elastic cord that will stretch beyond its resting length and then return to its resting length repeatedly.

A second wrapping loop 22 extends from the closed end 15 of the inside surface (i.e. the closed end of the aesthetic pouch 20). The second wrapping loop 22 is made from similar material as is the first wrapping loop 14, however it may be colored differently in order to match the color of the aesthetic pouch 20.

The faraday cage pouch 12 is configured to block Cellular, WiFi, Bluetooth, GPS, RFID, NFC, Key Fob. All frequencies between 800 MHz-10 GHz are blocked. Furthermore, CDMA, GSM, DCS, PHS, 3G, 4G, and LTE cellular signal transmissions are blocked. The pouch 12 has also been tested to block WiFi (2.4-6 GHz), Bluetooth (2.4 GHz) and GPS (1-2 GHz) signals, as well as RFID and NFC in 13.56 the MHz range. The pouch 12 blocks Carrier, hardware, and OS agnostics, GPS—global positioning systems, RFID—radio frequency identification, NFC—near field communication, EMP—electromagnetic pulses, and EMF—electromagnetic frequencies. Now turning to FIG. 2, we can further examine the function and structure of the present invention.

Figure 2:
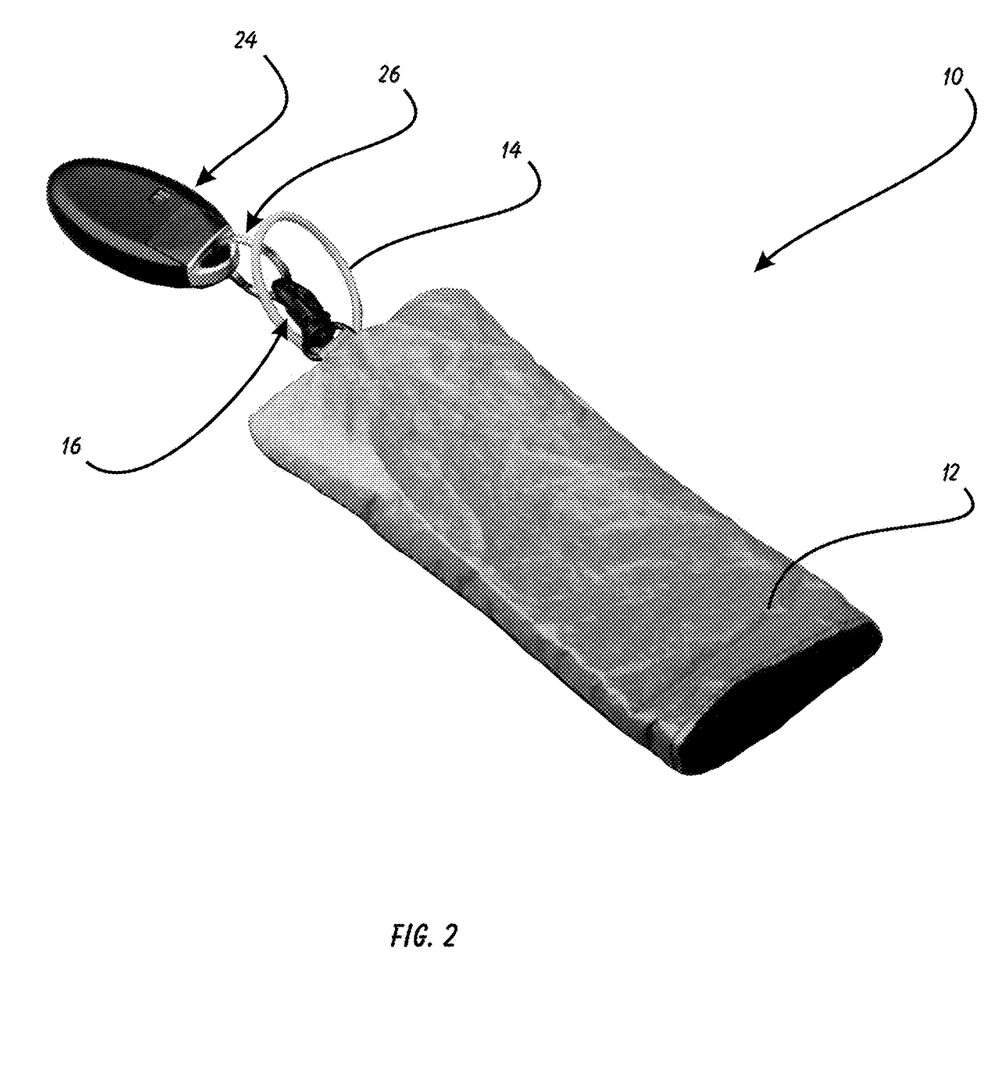
FIG. 2 is a perspective view of the pouch of FIG. 1 attached to a key fob.
Figure 3:
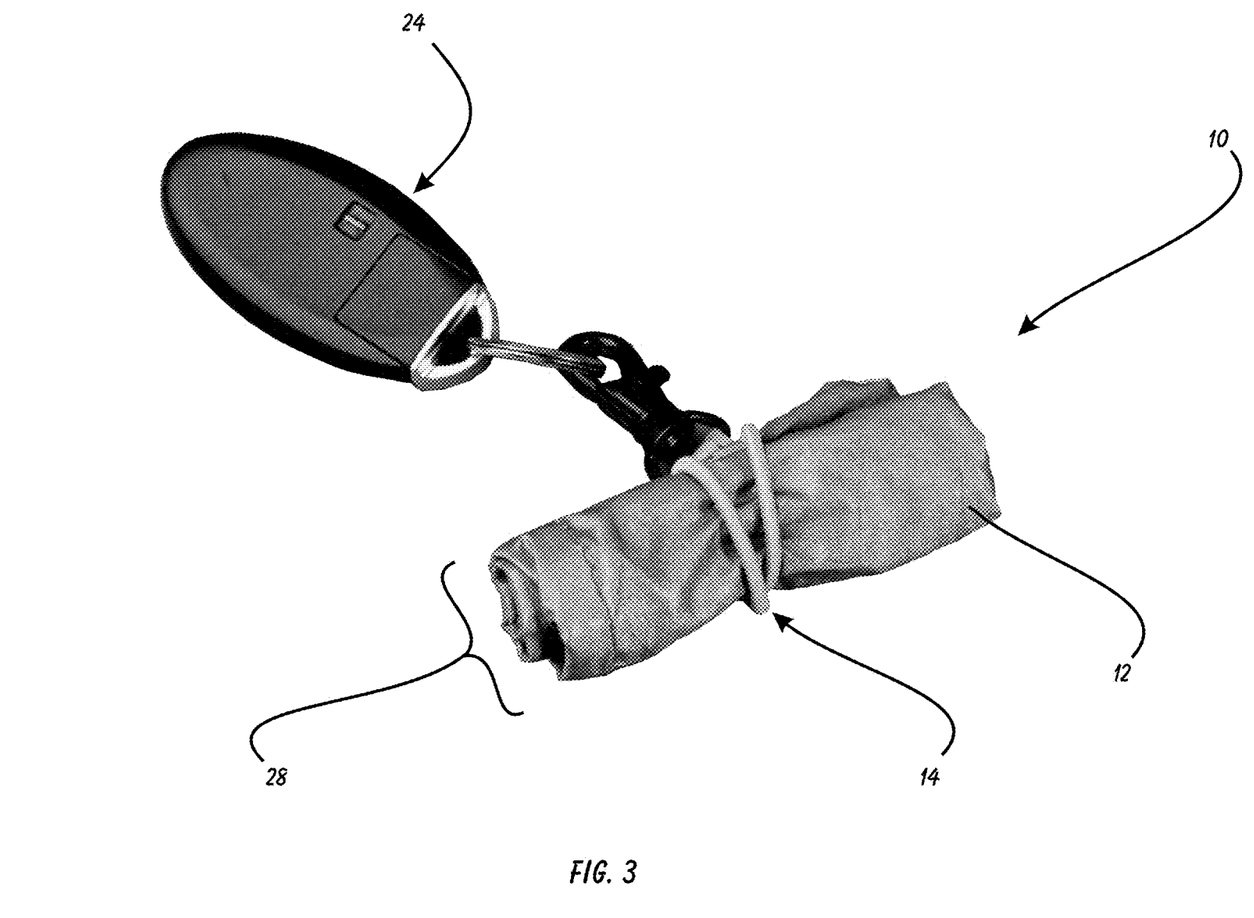
FIG. 3 is a perspective view of the pouch and key fob of FIG. 2.

FIG. 2 is a perspective view of the pouch 10 of FIG. 1 attached to a key fob 24. Here, as in FIG. 1, we would consider the pouch 10 to be in a "reversed" condition, wherein the faraday cage pouch 12 is the outer surface of the pouch 10. The fastening clip 16 has been attached to a key ring 26 extending from a key fob 24. In this fashion, the pouch 10 is securely attached to the key fob 24. FIG. 3 shows how the vehicle owner would generally carry the combination of the key fob 24 with pouch 10 attached to it.

FIG. 3 is a perspective view of the pouch 10 and key fob 24 of FIG. 2. Here, the pouch 10 has been rolled up tightly in a collapsed position 28. The pouch 10 is maintained in the collapsed position 28 by wrapping the first wrapping loop 14 around it. In this collapsed position 28, the pouch 10 is very small and compact, and therefore is very convenient to leave attached to the key fob 24 at all times, similar to other trinkets (medallions and the like) that users commonly attach to their key fobs 24. Because it is compact and always attached to the key fob 24, the key fob 24 can easily be placed within the pouch 10 at any time desired, as depicted below in FIGS. 4-6.

Figure 4:
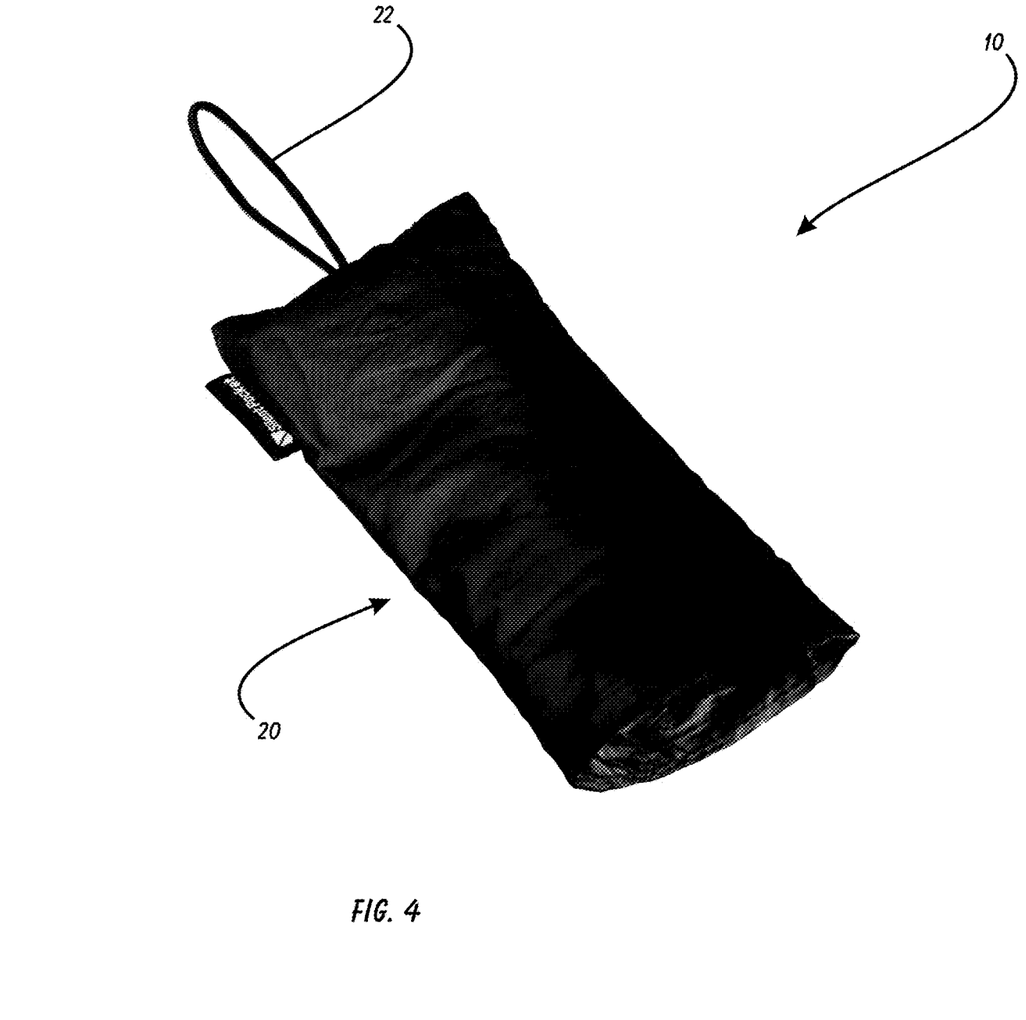
FIG. 4 is a perspective view of the pouch of FIG. 1, with its aesthetic pouch forming the exterior surface of the pouch.
Figure 5:
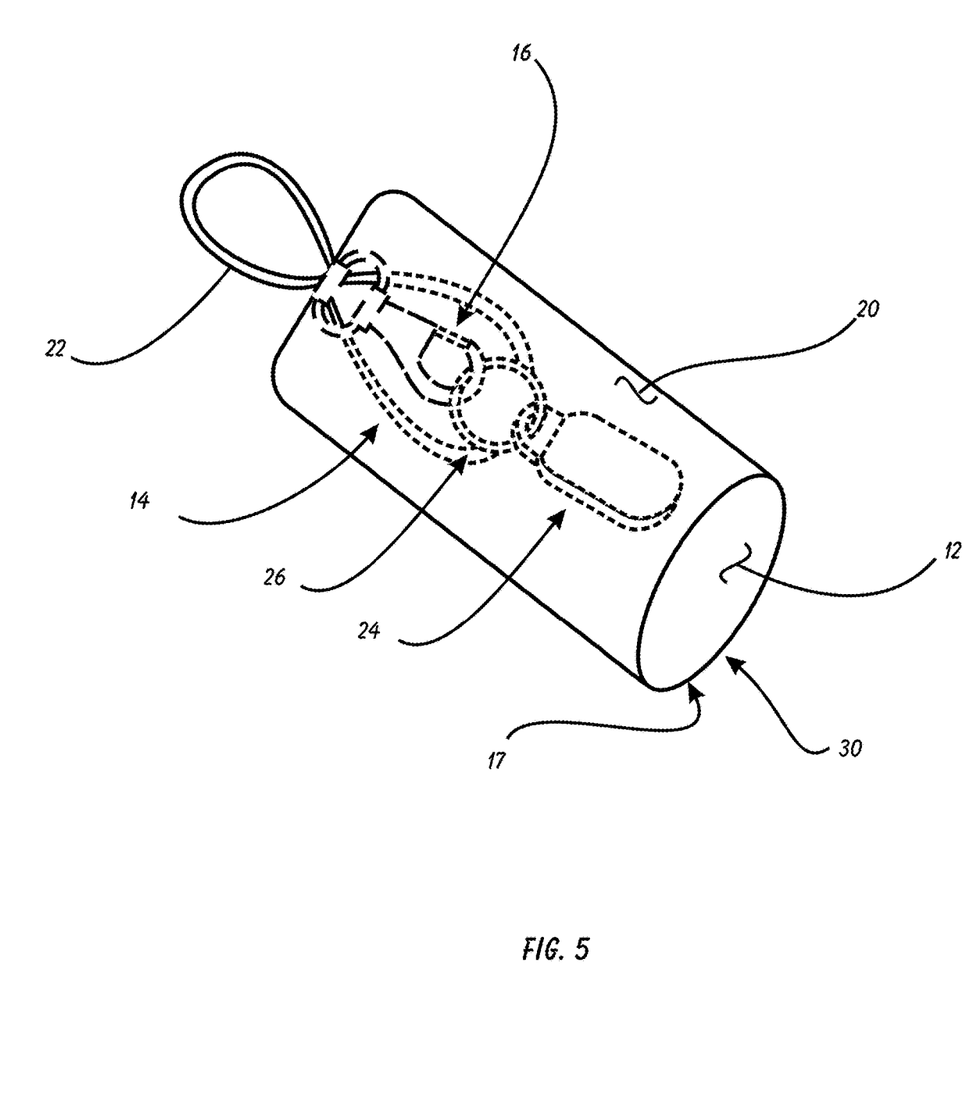
FIG. 5 is a perspective view of the pouch of FIG. 1 in the condition depicted in FIG. 4, and housing a key fob.

FIG. 4 is a perspective view of the pouch 10 of FIG. 1, with its aesthetic pouch 20 forming the exterior surface of the pouch 10. Here, the pouch's 10 surfaces have been reversed, so that the aesthetic pouch 20 is now the outer surface of the pouch 10 (and the faraday cage pouch [12] is the inner surface of the pouch 10. The two surfaces were reversed by turning the pouch 10 inside-out (from the condition shown in FIG. 1 to the condition shown in FIG. 4). The second wrapping loop 22 is now protruding from the outer surface of the pouch 10. FIG. 5 shows the interior of the pouch 10.

FIG. 5 is a perspective view of the pouch 10 of FIG. 1 in the condition depicted in FIG. 4, and housing a key fob 24. As shown, once the pouch 10 has been turned inside-out, the key fob 24 is now located inside of the faraday cage pouch 12, securely attached thereto by the key ring 26 and fastening clip 16. Even with the mouth 17 left open as shown here, a vast majority of electronic signals will be blocked by the faraday cage pouch 12, however, most users will complete the blocking of the signals by securing the pouch 10 as shown in FIG. 6.

Figure 6:
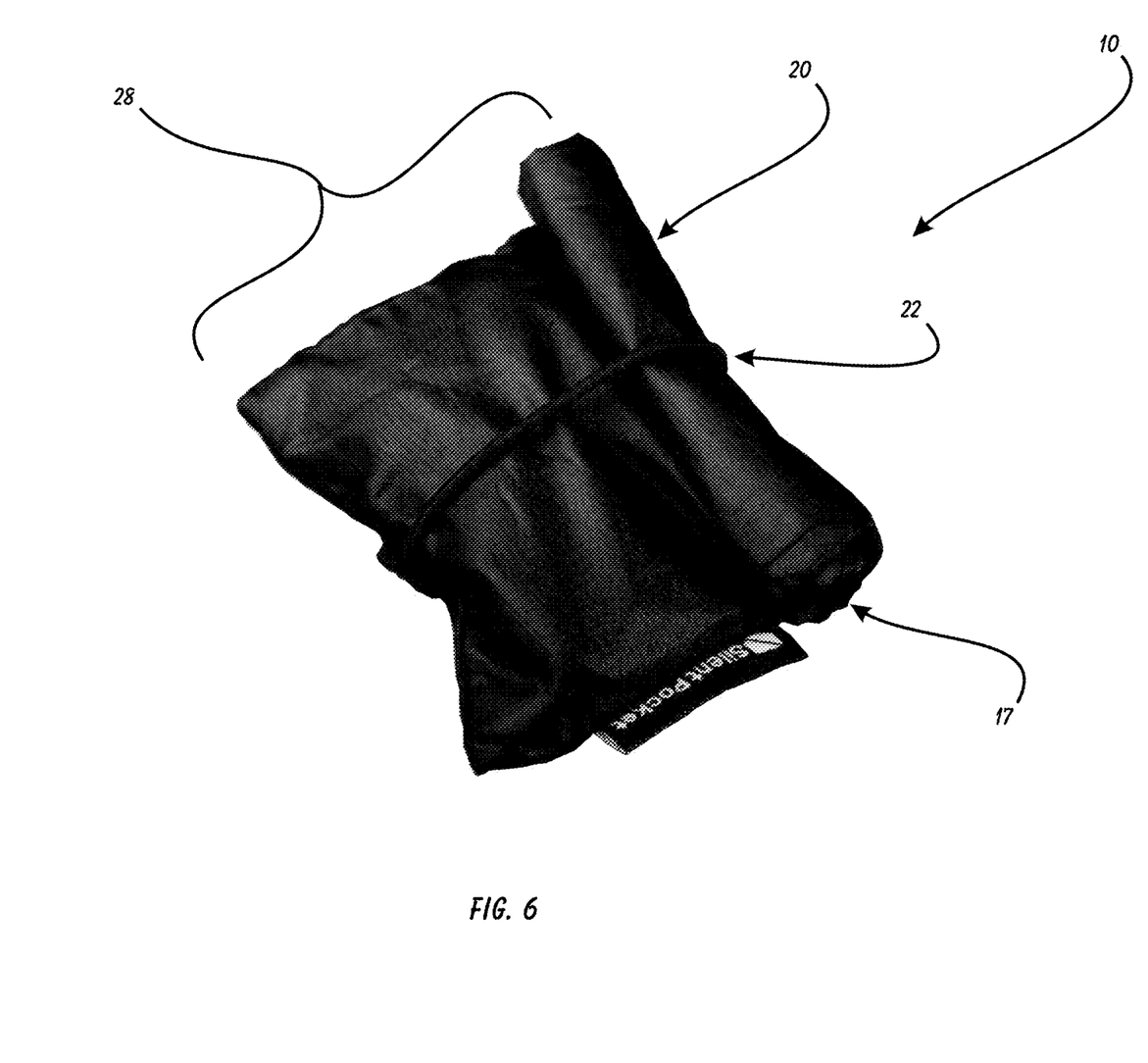
FIG. 6 is a perspective view of the pouch of FIG. 1 in its secured position.

FIG. 6 is a perspective view of the pouch 10 of FIG. 1 in its secured position 28. In the secured position, the open end of the pouch 10 is rolled up so that the mouth 17 is now in the center of the rolled-up portion. The second wrapping loop 30 has then been stretched and placed around the pouch 10 (including the rolled-up portion). In this secured position 28, the pouch 10 is very compact and fully secures the key fob [24] from hacking in any of the ways described herein above.

Although not depicted here, there may be an option to lock the pouch 10. The lockable option is designed to satisfy lock out tag out laws, osha compliance and digital forensics, safe rooms, lock boxes and storage. The lock (not shown) could be locked once the key fob or other item has been placed within the pouch 10.

The preferred method for this version and other preferred versions of the pouch 10 of the present invention is to (a) store the pouch 10 in a collapsed position, wherein the pouch 10 may be in a reversed condition, wherein the faraday cage pouch [12] is the outer surface of the pouch 10. Next, (b) the key fob (or other item for which EMF protection is desired) is placed in close proximity to the pouch 10. Finally, (c) the key fob or other item is placed within the faraday cage pouch [12]. In cases where the faraday cage pouch [12] was in a reversed condition at the initiation of the process, the pouch 10 is un-reversed, so that the faraday cage pouch [12] is the inside of the pouch 10, and the aesthetic pouch [20] is the outer surface of the pouch 10. In other versions of the method, the pouch 10 is in a collapsed position 28 (and potentially also in the reversed condition). In further method versions, the pouch 10 is placed in a secured position [28] with the mouth [17] of the pouch 10 contained within a rolled-up portion, which is then bound by a wrapping loop [30].

While the previous description of FIGS. 1-6 relate to a pouch 10 for a key fob [24], it should be understood that the pouch 10 could also be created in a variety of sizes and shapes, so as to be used to shield other types of devices, such as laptops, tablets, cellular telephones, wallets and the like. Computing devices placed within the pouch 10 will remain in a "sleep" state, thereby prolonging battery life while also preventing wireless hacking.

Furthermore, either the faraday cage pouch [12] or the aesthetic pouch [20] could be manufactured from a variety of materials so as to provide additional protection to objects contained within the pouch 10. For example, fireproofing protection could be provided via the incorporation of silicone coated fiberglass fabric, kevlar, aluminized materials, silica cloth liner, kevlar woven material, PBI, Aramids—para and meta, FR cotton, Coated nylon, Carbon foam (CFOAM), Polyhydroquinone—dimidazopyridine, Melamine, Modacrylic into the pouches [12], [20]. The pouches [12], [20] could also include scent-barrier materials, such as activated carbon, carbon lining and taffeta. Still further, the pouches [12], [20] could include additional sound-proofing protection by incorporating mass loaded vinyl, foam, acoustic padding, etc.

Figure 7A:
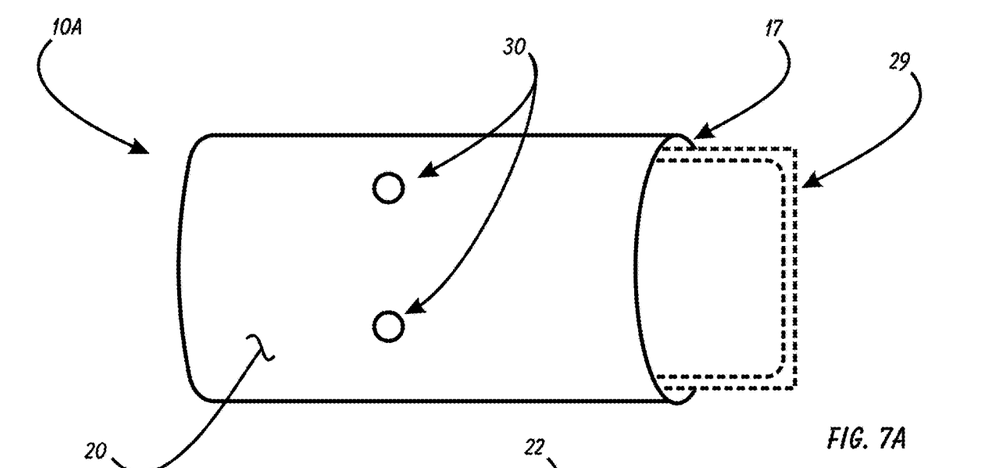
FIGS. 7A, 7B and 7C are front, back and front views of an alternate embodiment of the present invention.
Figure 7B:
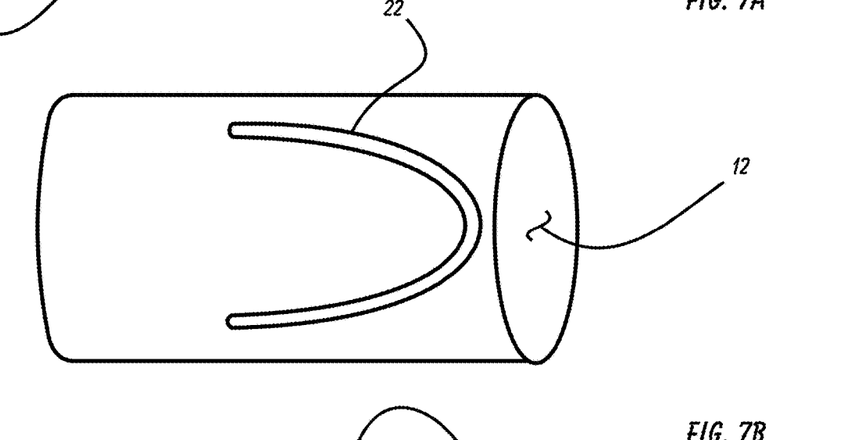
Figure 7C:
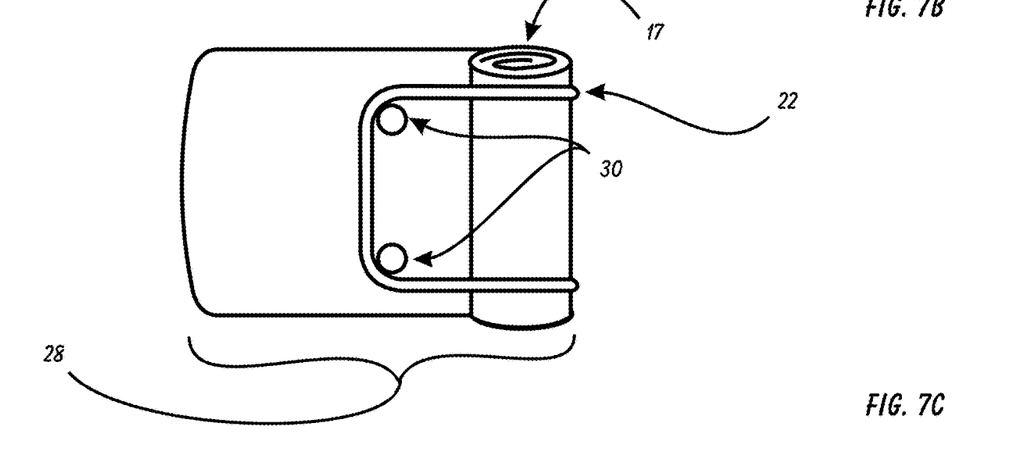

If we now turn to FIGS. 7A-7C, we can examine an alternate embodiment of the pouch 10A of the present invention. This version 10A may be better suited to encasing items that are larger than a key fob, such as laptops or computing tablets 29. The front side of the aesthetic pouch 20 has a pair of closure buttons 30 attached to it, such that they protrude from the face of the pouch 20. These buttons 30 could be pegs, hooks or other devices, and further could be provided in a variety of numbers (more or less than the two shown here). The back side of the pouch 10A is shown in FIG. 7B. Here, the second wrapping loop 22 is attached and extends therefrom. This pouch 10A is placed into its secured position 28 as shown in FIG. 7C by rolling up the open end of the pouch 10A (to roll up the mouth 17). The second wrapping loop 22 is then stretched over the wrapped-up portion and around the closure buttons 30. In the secured position 28, the laptop 29 will be secured from hacking within the faraday pouch 12.

Figure 8A:
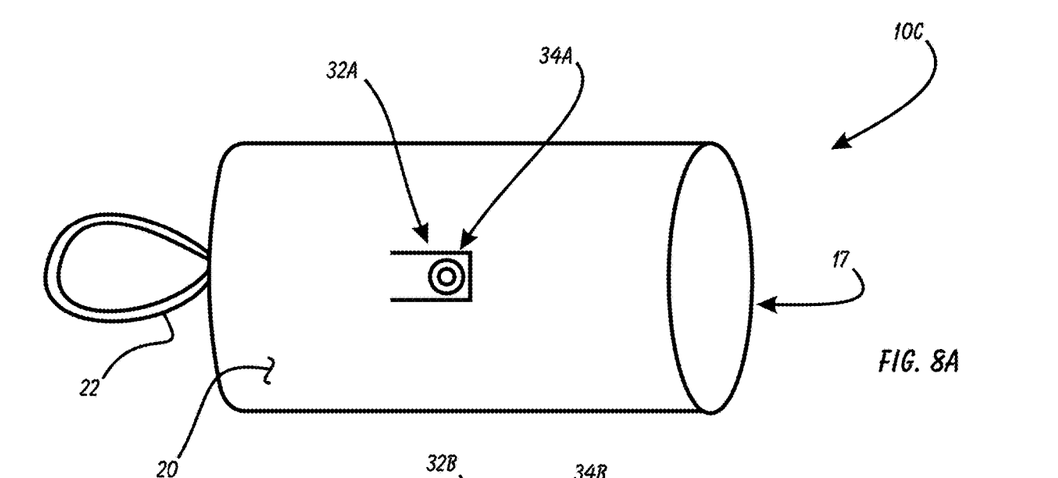
FIGS. 8A, 8B and 8C are front, back and front views of an embodiment of the present invention having a lockable closure.
Figure 8B:
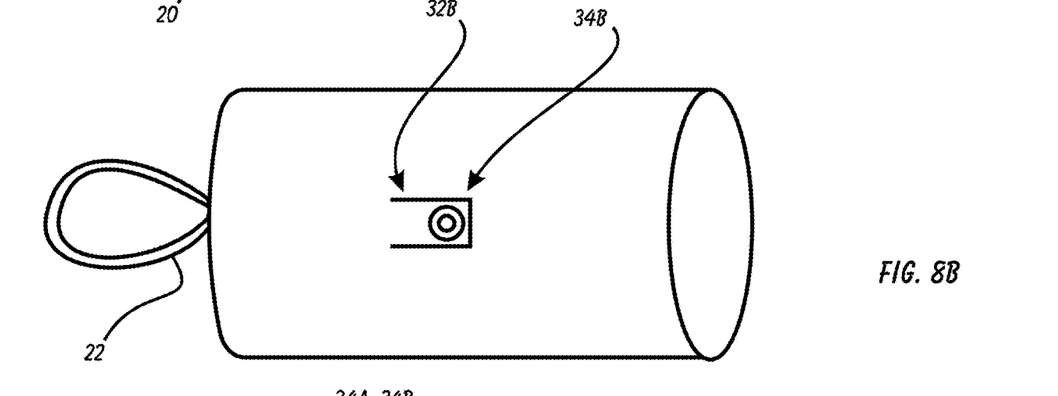
Figure 8C:
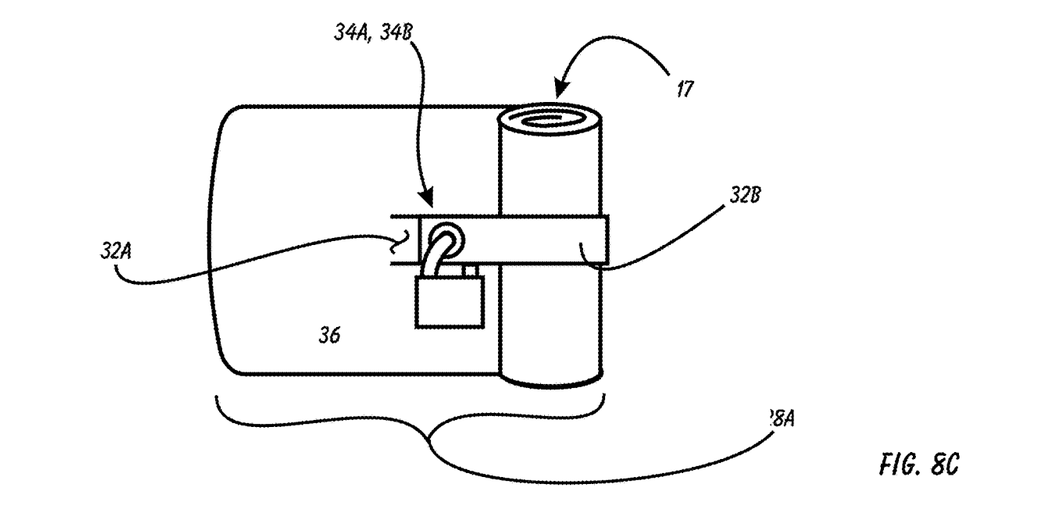

Now turning to FIGS. 8A-8C, we can examine yet another optional feature that could be incorporated into any embodiment of the pouch of the present invention. The pouch 10C of FIGS. 8A-8C has a lockable closure added to the other ways of securing the pouches. A preferred set of features to create this lockability functionality has a first locking tab 32A on the front side of the pouch 20. The locking tab 32A has a reinforced aperture 34A formed in it (such as an "eyelet"). A second locking tab 32B extends from the back side of the pouch 20, as shown in FIG. 8B. The second locking tab 32B has a second reinforced aperture 34B.

When the open end of the pouch 10C is rolled up to close the mouth 17, the second locking tab 32B is wrapped over the rolled-up portion until it aligns with the first locking tab 32A. A locking device 36 (e.g. padlock) is then locked through the reinforced apertures 34A, 34B, thereby preventing the pouch 10C from being opened without first removing the lock 36. This position is referred to as the secured and locked position 28A.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:
1. A container, comprising:
 a pouch formed from an outer layer and an inner layer, said inner layer comprising a series of thin metallic wires configured to block transmission of electronic waves therethrough, said pouch forming a closed end and a mouth at an opposing open end; and
 a loop element extending from said closed end of said outer layer,
 at least one closure button extending from said outer layer at a location between said open end and said closed end,
 wherein said loop element extends from a first side of said outer layer and said at least one closure button extends from a second side of said outer layer, and
 wherein said pouch and said loop element are cooperatively configured such that said open end can be rolled towards said at least one closure button and said loop element can be stretched over said rolled portion of said pouch and around said at least one closure button.
2. The container of claim 1, further comprising:
 a fastener ring extending from said closed end of said pouch; and
 a fastener clip extending from said fastener ring.
3. The container of claim 2, further comprising:
 a second loop element extending from said closed end of said pouch.
4. The container of claim 3, wherein said pouch is flexible, such that it can be rolled around itself.
5. The container of claim 4, wherein said first and second loop elements are formed from elastic cord material.
6. The container of claim 5, wherein said inner layer defines a faraday cage.
7. The container of claim 6, wherein said outer layer comprises materials including nylon mesh, leather, waterproof plastic or rubber and highly elastic fabric.
8. A container comprising:
 a pouch formed from an outer layer and an inner layer, said inner layer comprising a series of thin metallic wires configured to block transmission of electronic waves therethrough, said pouch forming a closed end and a mouth at an opposing open end;

a loop element extending from said closed end of said outer layer, wherein said loop element defines non-elastic tab extending from a first side of said outer layer, said non-elastic tab including an aperture formed therethrough;

a second non-elastic tab extending from a second side of said outer layer, said second non-elastic tab including an aperture formed therethrough, wherein, said first non-elastic tab, said second non-elastic tab and said pouch are cooperatively design such that said open end of said pouch can be rolled towards said first non-elastic tab until said second non-elastic tab can be wrapped around said rolled-up open end of said pouch such that said apertures of said first and second non-elastic tabs are in relative juxtaposed alignment, and a locking device passing through said apertures of said first and second non-elastic tabs whereby they are secured to one another to prevent said rolled-up open end of said pouch from being unrolled.

9. A method for protecting a device, comprising:

providing a pouch formed from an outer layer and an inner layer, said inner layer comprising a series of thin metallic wires configured to block transmission of electronic waves therethrough, said pouch forming a closed end and a mouth at an opposing open end to form an internal compartment, and a loop element extending from said closed end of said outer layer;

placing said device through said mouth and into said internal compartment;

rolling a portion of said open end towards said closed end to seal said mouth within said rolled-up portion; and stretching said loop element around said rolled up portion and said closed end.

\* \* \* \* \*